(12) United States Patent
Zuo et al.

(10) Patent No.: US 6,437,437 B1
(45) Date of Patent: Aug. 20, 2002

(54) SEMICONDUCTOR PACKAGE WITH INTERNAL HEAT SPREADER

(75) Inventors: Jon Zuo, Lancaster; Scott D. Garner, Lititz, both of PA (US)

(73) Assignee: Thermal Corp., Stanton, DE (US)

( * ) Notice: Subject to any disclaimer, the term of this patent is extended or adjusted under 35 U.S.C. 154(b) by 0 days.

(21) Appl. No.: 09/753,893

(22) Filed: Jan. 3, 2001

(51) Int. Cl.⁷ .............................................. H01L 23/10
(52) U.S. Cl. ...................................... 257/710; 257/704
(58) Field of Search .............................. 257/710, 704, 257/713, 714; 165/104, 33, 26; 361/385; 357/82

(56) References Cited

U.S. PATENT DOCUMENTS

| | | | |
|---|---|---|---|
| 4,573,067 A | * 2/1986 | Tuckerman et al. | ........... 357/82 |
| 4,697,205 A | 9/1987 | Eastman | ........ 357/82 |
| 4,833,567 A | * 5/1989 | Saaski et al. | ................ 361/385 |
| 4,912,548 A | 3/1990 | Shanker et al. | ............... 357/82 |
| 5,097,387 A | 3/1992 | Griffith | ........................ 361/385 |
| 5,239,200 A | * 8/1993 | Messina et al. | ............. 257/714 |
| 5,708,297 A | 1/1998 | Clayton | ........................ 257/723 |
| 5,719,444 A | * 2/1998 | Tilton et al. | ................. 257/714 |
| 5,780,928 A | 7/1998 | Rostoker et al. | ............. 257/713 |
| 5,880,524 A | * 3/1999 | Xie | ............................... 257/704 |
| 6,085,831 A | * 7/2000 | DiGiacomo et al. | ... 165/104.33 |
| 6,302,192 B1 | * 10/2001 | Dussinger et al. | ..... 165/104.26 |

* cited by examiner

*Primary Examiner*—Hoai V. Ho
*Assistant Examiner*—Thinh Nguyen
(74) *Attorney, Agent, or Firm*—Duane Morris LLP

(57) ABSTRACT

A semiconductor package is provided that includes a substrate having a top surface, a cover, and at least one semiconductor device attached to the top surface of the substrate. The cover is secured to the substrate so as to create a space between the interior surface and the substrate such that the semiconductor device resides within the space. The cover has an interior surface comprising a plurality of micro-channels. A wick is positioned in confronting relation to the plurality of micro-channels and the semiconductor device, with a two-phase vaporizable liquid disposed within the space.

28 Claims, 4 Drawing Sheets

SEMICONDUCTOR PACKAGE WITH INTERNAL HEAT SPREADER

FIELD OF THE INVENTION

The present invention generally relates to thermal management in semiconductor packages, and more particularly to a heat spreading package architecture that is adapted for use with semiconductor devices to spread heat evenly across an outer surface of the package.

BACKGROUND OF THE INVENTION

The performance of electronic circuits and their semiconductor devices ("chips") is limited by temperature. Semiconductor device performance degrades when the internal temperature reaches or exceeds a particular limit. For example, in silicon integrated circuit devices, for each ten degree centigrade rise in junction temperature, the operating lifetime of the semiconductor device is decreased by a factor of at least two. Demands by OEMs for smaller package sizes and increased device densities has resulted in higher power densities, with the concomitant need for efficient heat dissipation becoming extremely important.

This industry need is compounded, in next generation, highly integrated semiconductor devices by the occurrence of "hot spots", i.e., localized areas on the chip having relatively high thermal energy generation. These hot spots arise at locations on the chip where significant electrical activity occurs, e.g., processor, I/O control circuits, etc. The manner of cooling these devices has depended upon many parameters, including the space available for the cooling process, the temperature to be encountered, the location(s) of hot spots, and the ability to distribute or "spread" the thermal energy over sufficient surface area to provide for efficient heat transfer. In the past, simply passing a fluid over the package containing the semiconductor device or, over a finned heat sink that is attached to the package, was sufficient to maintain the semiconductor at safe operating temperatures. Different cooling fluids have been used, depending upon the application and the density of the electronic devices in a given circuit. Boiling liquids are often used, such as fluorinated hydrocarbon refrigerants, which are delivered to the semiconductor device in liquid form, and are then boiled to remove heat. These systems often have the highest heat removal rate for a limited area, but require a considerable amount of power to operate, i.e. to be pumped to and from the heat transfer site.

It is also well known in the art to employ heat pipes to cool semiconductor devices and packages. For example, in U.S. Pat. No. 4,697,205, issued to Eastman, a semiconductor circuit construction is provided in which the semiconductor junction is constructed as an integral part of a heat pipe to eliminate the package casing which tends to interfere with heat flow. The semiconductor chip material directly forms one wall of the casing of a heat pipe which is constructed as a hollow wafer-like configuration.

In U.S. Pat. No. 4,912,548, issued to Shanker et al., a housing is provided with a heat pipe that passes through the lid. The heat pipe terminates within the housing cavity at a hot end. A quantity of working fluid, such as fluorinated octane, is contained within the package cavity. The heat pipe communicates with cooling fins that produce a cold end. Heat from the semiconductor device inside the housing boils the working fluid. The fluid vapor passes along the heat pipe and is condensed at the cold end to be converted back to liquid.

In U.S. Pat. No. 5,097,387, issued to Griffith, a circuit chip package is disclosed which employs low eutectic or melting point solder as a thermally conductive medium between each circuit chip and the package cover. The package cover consists of a heat exchanger which includes a conventional heat pipe structure including a heat transfer fluid filled chamber, and a plurality of apertured pipes through which is passed another cooling fluid, such as air, to remove heat from the heat transfer fluid.

In U.S. Pat. No. 5,708,297, issued to Clayton, a multichip semiconductor module The is disclosed that is compatible with SIMM memory sockets. The multichip module includes a molded module frame and a composite semiconductor substrate subassembly received in a cavity in the frame. A cover plate and frame, alone or in combination, contain multiple compartments or channels through which gas or liquid coolant materials can be circulated to effectively distribute or remove heat generated from the semiconductor devices. In one embodiment, the cover plate includes a thin heat pipe.

In U.S. Pat. No. 5,780,928, issued to Rostoker et al., an electronic system is disclosed that provides thermal transfer from a semiconductor die in a semiconductor package by at least partially filling a cavity in the package with a thermally conductive fluid, immersing a heat collecting portion of a heat pipe assembly into the fluid, and sealing the cavity. In order that the thermally conductive fluid does not chemically attack the die or its electrical connections, the die and connections are completely covered with an encapsulating coating of an inorganic dielectric material by any of a variety of techniques. The heat pipe provides heat transfer from within the package to an external heat sink. In one embodiment, an absorptive wick is disposed within the package to transport condensed coolant to close proximity with the die.

In U.S. Pat. No. 5,880,524, issued to Xie, a package is provided for spreading the heat generated by a semiconductor device. The semiconductor device, such as a CPU, is mounted to a package substrate, a cover is attached to the package substrate creating a space therebetween for accommodating the semiconductor device. The package cover includes an external top surface and an external bottom surface and an inner cavity that comprises a heat pipe. The semiconductor device is thermally coupled to the bottom external surface of the cover.

These and other prior art devices use heat pipes to transfer thermal energy away from the semiconductor device and its package, but do not provide an efficient heat spreading mechanism for distributing the thermal energy generated by the chip across the entire package. Moreover, prior art semiconductor packages incorporating heat pipe structures require additional pockets or chambers be formed in the package that increase its overall size. This also significantly increases the cost of such packages. There is a need for a semiconductor packaging structure that efficiently and evenly spreads thermal energy generated on a chip across a substantial portion of the package so that the thermal energy may be removed rapidly and effectively from the package.

SUMMARY OF THE INVENTION

A semiconductor package is provided that comprises a substrate having a top surface, a cover, and at least one semiconductor device attached to the top surface of the substrate. The cover is secured to the substrate so as to create a space between the interior surface and the substrate such that the semiconductor device resides within the space. The cover has an interior surface comprising a plurality of micro-channels. A wick is positioned in confronting relation to the plurality of micro-channels and the semiconductor device, with a two-phase vaporizable liquid disposed within the space.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

Figure 1:
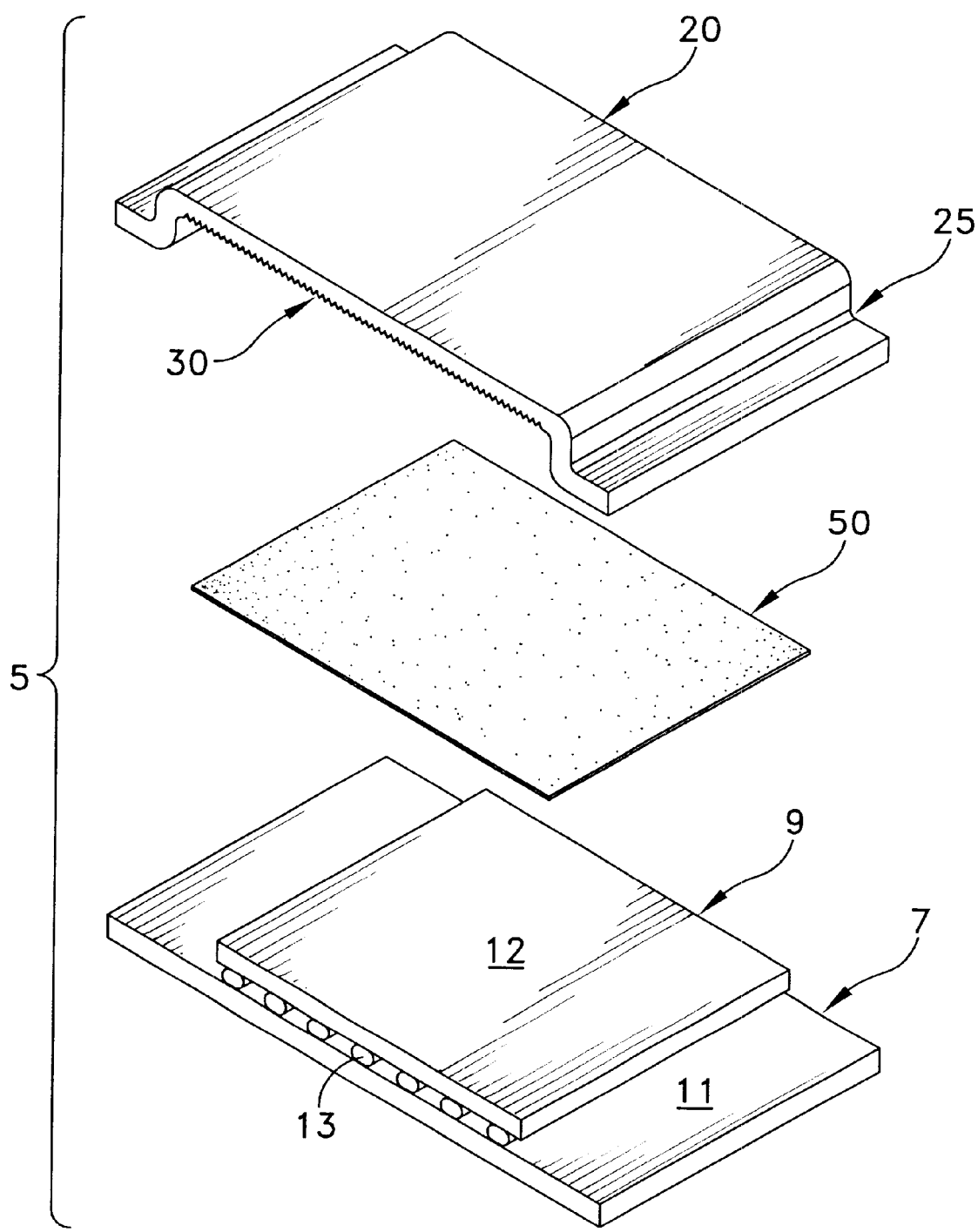
FIG. 1 is an exploded perspective view of a semiconductor package with internal heat spreader formed in accordance with one embodiment of the present invention.
Figure 2:
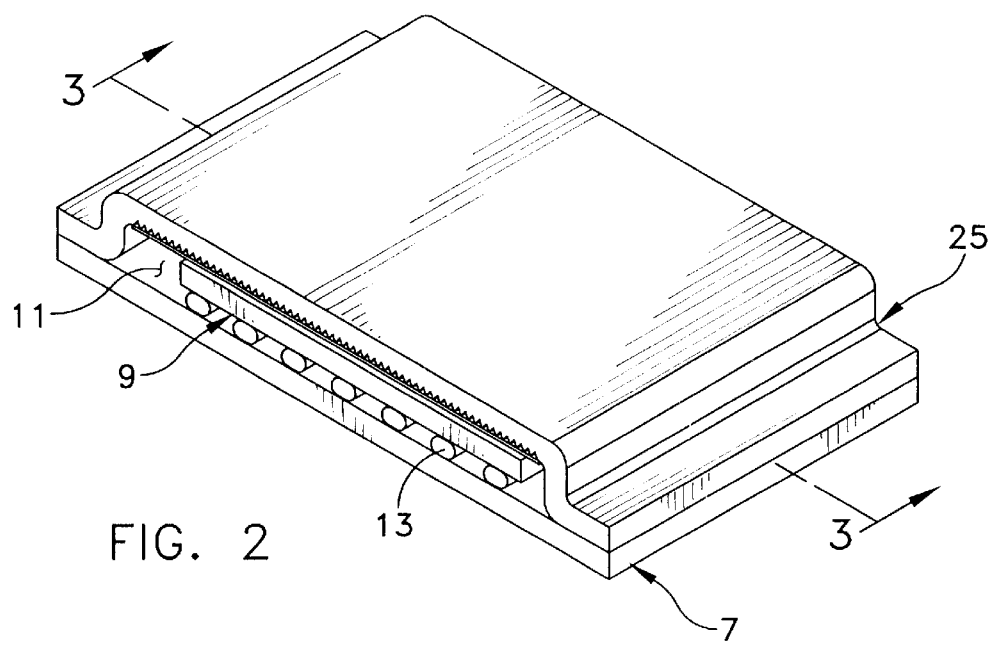
FIG. 2 is a perspective view of the semiconductor package with internal heat spreader shown in FIG. 1, but with an edge open for clarity of illustration.

This description of preferred embodiments is intended to be read in connection with the accompanying drawings, which are to be considered part of the entire written description of this invention. In the description, relative terms such as "horizontal," "vertical," "up," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship.

Referring to FIG. 1, a semiconductor package 5 having an internal heat spreader formed in accordance with the present invention includes a substrate 7 having a semiconductor device 9 mounted on the top surface 11 of substrate 7. Semiconductor device 9 includes a top surface 12, and is often mechanically and electrically coupled to the top surface 11 of substrate 7, via a plurality of solder bump connections 13. Substrate 7 may contain one or more wiring layers (not shown) that electrically interconnect semiconductor device 9 to pins or the like (not shown) located along a bottom surface 15 of substrate 7.

Figure 3:
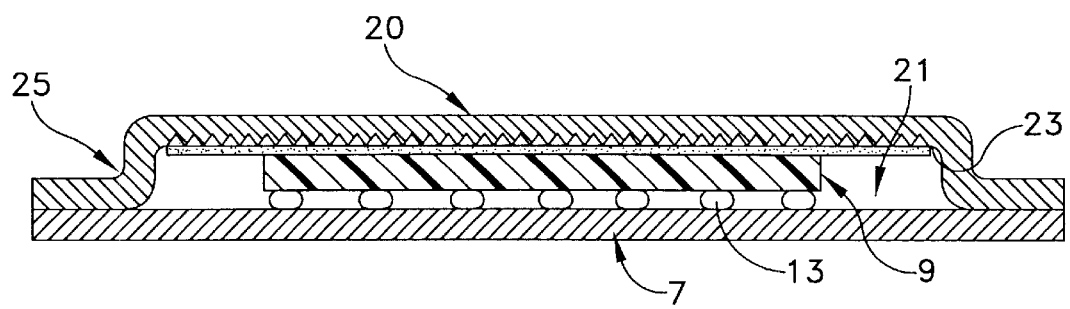
FIG. 3 is a cross-sectional view of semiconductor package with internal heat spreader shown in FIGS. 1 and 2, as taken along line 3—3 in FIG. 2.
Figure 4:
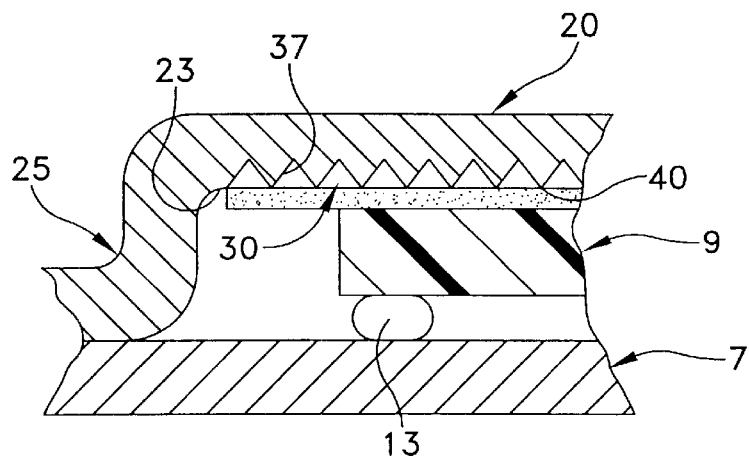
FIG. 4 is an enlarged and broken-away cross-sectional view of a corner portion of the semiconductor package with internal heat spreader shown in FIG. 3.
Figure 5:
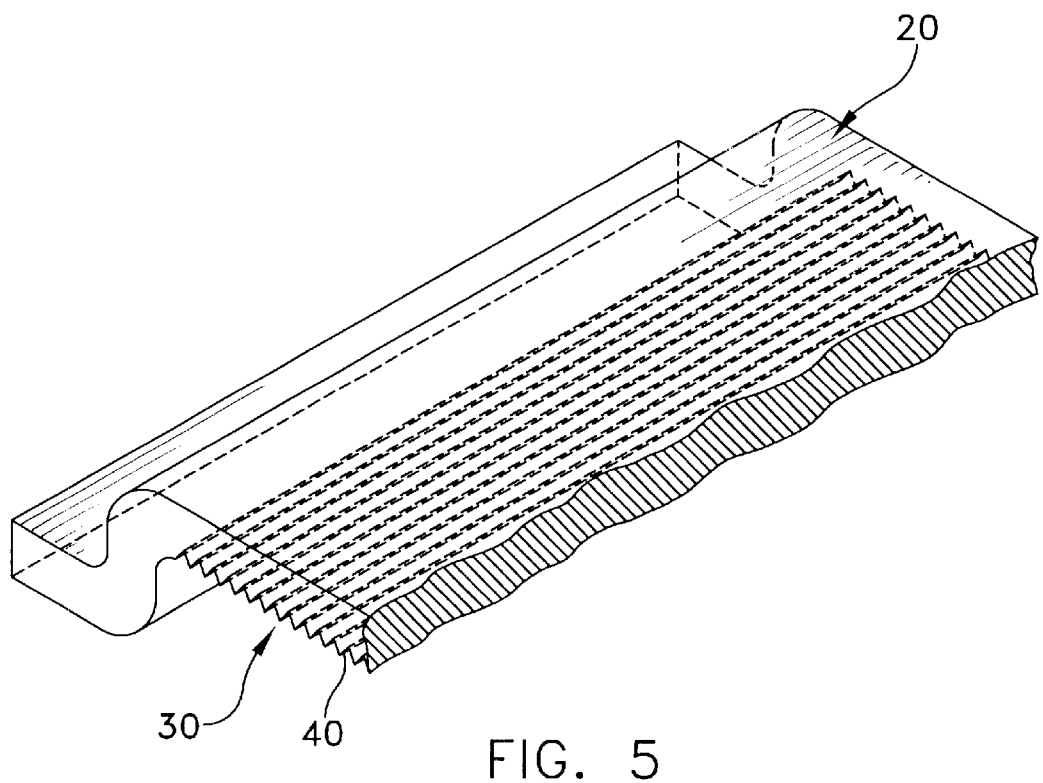
FIG. 5 is a broken-away, perspective view of a cover/lid formed in accordance with the invention showing longitudinally extending micro-channels on an interior surface in phantom.
Figure 6:
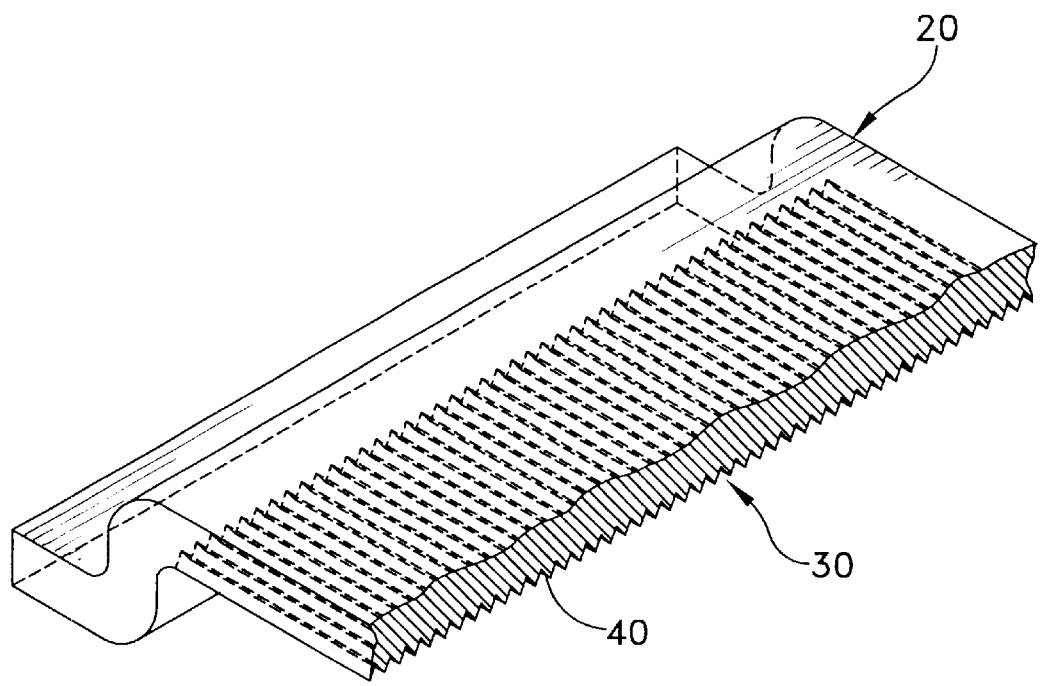
FIG. 6 is a broken-away, perspective view of a cover/lid formed in accordance with the invention showing transversely extending micro-channels on an interior surface in phantom.

Referring to FIGS. 3–5, a cover/lid 20 is attached to substrate 7 and forms a void space or gap 21 between the interior surface 23 of cover/lid 20 and top surface 11 of substrate 7. Mounting flanges 25 are formed along the peripheral edges of cover/lid 20 so that substrate 7 may be hermetically fastened to cover/lid 20. Mounting flanges 25 serve to support cover/lid 20 above substrate 7 and semiconductor device 9. The height of mounting flanges 25 is selected such that gap 21 is sized to accept semiconductor device 9.

Interior surface 23 of cover/lid 20 comprises a plurality of channels or grooves 30. Each channel or groove 30 may be machined into interior surface 23 so as to extend the length of cover/lid 20, either longitudinally (FIG. 3) or transversely (FIG. 5), and is defined by a pair of converging walls 37 so that each channel or groove 30 comprises a triangular cross-sectional profile including an apex 40. In this way, channel or groove 30 define between them a plurality of "V"-shaped, parallel striations on interior surface 23 of cover/lid 20.

In one embodiment of the present invention, a wick 50 is positioned adjacent to apexes 40 of channels or grooves 30 and between interior surface 23 and top surface 12 of semiconductor device 9 so as to be positioned within semiconductor package 5 in confronting relation with interior surface 23 and top surface 12, i.e., face-to-face, and with no intervening structures therebetween. Wick 50 is coextensive with interior surface 23, and comprises a discrete ( i.e., stand alone and without substantial fixation to any surface) substantially planar sheet of Aluminum-Silicon-Carbide (AlSiC) or Copper-Silicon-Carbide (CuSiC) having an average thickness of about 0.3 to about 0.6 mm. Wick 50 may also be formed from a sintered powder, a copper screen, or by etching a porous structure. The planarity of wick 50 allows it to be placed between interior surface 23 of cover/lid 20 and top surface 12 of semiconductor device 9 without any intervening supporting structures.

Interior surface 23 of cover/lid 20 and wick 50 together form a heat pipe, with the void space formed between converging walls 37 of channels or grooves 30 forming a plurality of vapor chambers that run the length (FIG. 3) or width (FIG. 5) of cover/lid 20. In operation, a two-phase vaporizable liquid (not shown) serves as the working fluid for the heat pipe/spreader formed by channels or grooves 30 and wick 50. In one embodiment, cover/lid 20 is cast from Aluminum-Silicon-Carbide (AlSiC), with a conventional chlorofluorocarbon liquid generally chosen as the two-phase vaporizable liquid since it is chemically compatible with Aluminum-Silicon-Carbide (AlSiC) and may possess a relatively high latent heat. As the two-phase vaporizable liquid is heated by semiconductor device 9 it volatilizes and travels vapor along channels or grooves 30 to regions of cover/lid 20 that are at a relatively lower temperature. The two-phase vaporizable liquid then condenses onto planar wick 50 and is drawn back to the relatively higher temperature regions via capillary action within wick 50.

Figure 7:
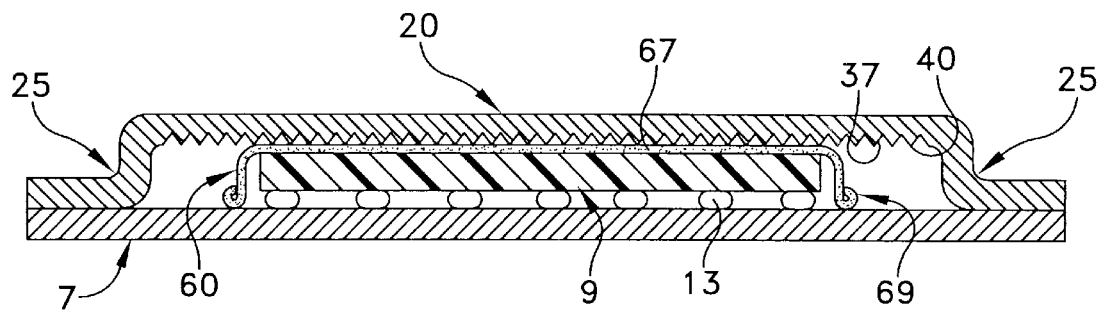
FIG. 7 is a cross-sectional view of semiconductor package with internal heat spreader similar to that shown in shown in FIGS. 1–3, but showing an alternative wick structure.
Figure 8:
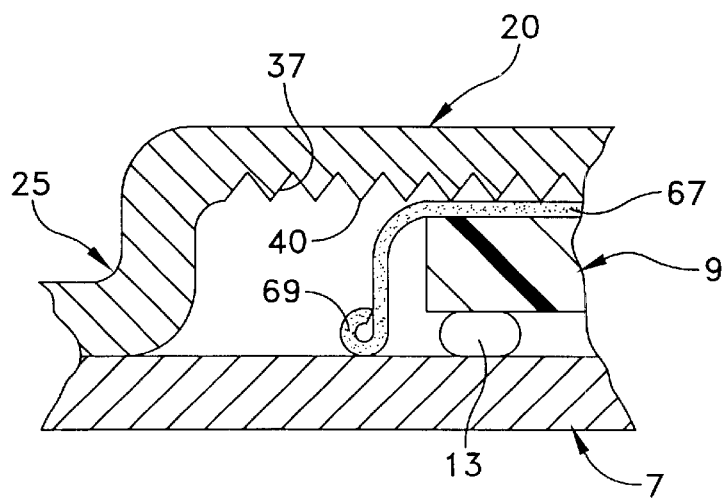
FIG. 8 is an enlarged and broken-away cross-sectional view of a corner portion of the semiconductor package with internal heat spreader shown in FIG. 7.

As a result of the superior heat transfer and spreading capabilities of semiconductor package 5, a substantially uniform heat flux is produced along the outer surface of cover/lid 20. This in turn makes it much easier to manage the transfer of heat away from the package. As such, conventional heat sinks or heat pipes may be attached to cover/lid 20 to carry heat away from semiconductor device 9. Of course, the internal structure of semiconductor package 5 may vary considerably from one design to another. For example, FIGS. 7 and 8 show an alternative wick 60 comprising a screen roll wick 65. Screen roll 65 includes a planar central section 67 and at least one wing 69 positioned at an end of planar central section 67 and adjacent to top surface 11 of substrate 7. Preferably, wick 60 includes wings 69 that extend along each side edge of semiconductor device 9. In one embodiment, wick 60 is formed from a copper mesh with wings 69 formed by rolling the peripheral edges of the mesh back upon themselves. As a result of positioning wings 69 adjacent to top surface 11 of substrate 7 portions of the two-phase vaporizable liquid that condenses on substrate 7 will be drawn back to higher heat regions via capillary action through wings 69 and planar central section 67.

It is to be understood that the present invention is by no means limited only to the particular constructions herein disclosed and shown in the drawings, but also comprises any modifications or equivalents within the scope of the claims.

What Is claimed Is:

1. A semiconductor package comprising:
   a substrate having a top surface;
   at least one semiconductor device attached to said top surface; and
   a cover having an interior surface comprising a plurality of parallel channels, said cover being secured to said substrate so as to create a space between said interior surface and said substrate such that said semiconductor device resides within said space;
   a wick positioned in confronting relation to said plurality of parallel channels and said semiconductor device; and
   a two-phase vaporizable liquid disposed within said space.

2. The semiconductor package according to claim 1 wherein said channels extend longitudinally across said interior surface.

3. The semiconductor package according to claim 1 wherein said channels extend transversely across said interior surface.

4. The semiconductor package according to claim 1 wherein said plurality of channels are each defined by a pair of converging walls and an apex.

5. The semiconductor package according to claim 4 wherein said wick is positioned adjacent to said apexes.

6. The semiconductor package according to claim 4 wherein said wick is coextensive with said interior surface.

7. The semiconductor package according to claim 1 wherein said wick comprises a discrete substantially planar sheet.

8. The semiconductor package according to claim 1 wherein said interior surface of said cover and said wick together form a heat pipe.

9. A semiconductor package comprising:
   a substrate having a top surface;
   at least one semiconductor device attached to said top surface of said substrate and having a top surface; and
   a cover having an interior surface comprising a plurality of parallel striations, said cover being secured to said substrate so as to create a space between said interior surface and said substrate such that said semiconductor device resides within said space;
   a single layer planar wick positioned between said plurality of parallel striations and said top surface of said semiconductor device so as to reside within said space; and
   a two-phase vaporizable liquid disposed within said space.

10. The semiconductor package according to claim 9 wherein said striations extend longitudinally across said interior surface.

11. The semiconductor package according to claim 9 wherein said striations extend transversely across said interior surface.

12. The semiconductor package according to claim 9 wherein said plurality of striations are each defined by a pair of converging walls and an apex.

13. The semiconductor package according to claim 12 wherein said wick is positioned adjacent to said apexes.

14. The semiconductor package according to claim 12 wherein said wick is coextensive with said interior surface.

15. The semiconductor package according to claim 9 wherein said wick comprises a discrete substantially planar sheet.

16. The semiconductor package according to claim 9 wherein said interior surface of said cover and said wick together form a heat pipe.

17. A semiconductor package comprising:
   a substrate having a top surface;
   at least one semiconductor device attached to said top surface; and
   a cover having an interior surface comprising a plurality of parallel grooves, said cover being secured to said substrate so as to create a space between said interior surface and said substrate such that said semiconductor device resides within said space;
   a wick positioned in confronting relation to said plurality of parallel grooves and said semiconductor device, said wick comprising at least one peripheral portion positioned adjacent to said top surface; and
   a two-phase vaporizable liquid disposed within said space.

18. The semiconductor package according to claim 17 wherein said at least one peripheral portion comprises a peripheral edge of said wick.

19. The semiconductor package according to claim 17 wherein said at least one peripheral portion comprises a rolled peripheral edge of said wick.

20. The semiconductor package according to claim 17 wherein said wick comprises a screen having a planar central section and at least one rolled wing portion positioned at an end of said planar central section and adjacent to said top surface of said substrate.

21. The semiconductor package according to claim 17 comprising peripheral portions extending along each side edge of said semiconductor device and positioned adjacent to said top surface.

22. The semiconductor package according to claim 17 wherein said wick is formed from a mesh with said at least one peripheral portion formed by rolling the peripheral edges of said mesh back upon themselves.

23. The semiconductor package according to claim 17 wherein said parallel grooves extend longitudinally across said interior surface.

24. The semiconductor package according to claim 17 wherein said parallel grooves extend transversely across said interior surface.

25. The semiconductor package according to claim 17 wherein said plurality of parallel grooves are each defined by a pair of converging walls and an apex.

26. The semiconductor package according to claim 17 wherein said wick is positioned adjacent to said apexes.

27. The semiconductor package according to claim 17 wherein said wick is coextensive with said interior surface.

28. A semiconductor package comprising:

a substrate having a top surface;

at least one semiconductor device attached to said top surface of said substrate and having a top surface; and a cover having an interior surface comprising a plurality of parallel channels arranged in confronting relation to said top surface of said at least one semiconductor device, wherein each of said plurality of parallel channels is defined by a pair of converging walls and an apex, said cover being secured to said substrate so as to create a space between said interior surface and said substrate such that said semiconductor device resides within said space;

a single layer planar wick positioned between said plurality of parallel channels and said top surface of said semiconductor device so as to reside within said space; and a two-phase vaporizable liquid disposed within said space.

* * * * *